United States Patent
Imamura

(10) Patent No.: US 6,204,567 B1
(45) Date of Patent: *Mar. 20, 2001

(54) SEMICONDUCTOR DEVICE WITH CIRCUIT CELL ARRAY AND ARRANGEMENT ON A SEMICONDUCTOR CHIP

(75) Inventor: Youichi Imamura, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/672,064

(22) Filed: Jun. 26, 1996

Related U.S. Application Data

(62) Division of application No. 08/359,339, filed on Dec. 19, 1994, now Pat. No. 5,585,666, which is a continuation of application No. 08/267,644, filed on Jun. 29, 1994, now abandoned, which is a continuation of application No. 07/778,853, filed on Dec. 23, 1991, now abandoned.

(30) Foreign Application Priority Data

Apr. 24, 1990 (JP) .................................................. 2-108014

(51) Int. Cl.$^7$ ................................................. H01L 23/544
(52) U.S. Cl. .......................... 257/797; 257/668; 257/786; 257/207
(58) Field of Search .................................. 257/797, 786, 257/207, 203, 666, 668, 672, 676, 691, 692, 773, 780; 438/401, 462, 926

(56) References Cited

U.S. PATENT DOCUMENTS

| | | | |
|---|---|---|---|
| 4,535,531 | * | 8/1985 | Bhatia et al. ......................... 257/592 |
| 4,721,365 | * | 1/1988 | Nishimura ............................ 350/336 |
| 4,811,081 | * | 3/1989 | Lyden .................................... 257/786 |
| 4,902,646 | * | 2/1990 | Nakano .................................. 437/203 |
| 4,930,000 | * | 5/1990 | Kantz .................................... 257/786 |
| 5,008,728 | * | 4/1991 | Yamamura et al. ................. 257/207 |
| 5,064,706 | | 11/1991 | Ueda et al. ........................... 428/131 |
| 5,083,181 | * | 1/1992 | Yoshida et al. ...................... 257/207 |
| 5,089,874 | * | 2/1992 | DeGuichi et al. ................... 257/797 |
| 5,208,782 | * | 5/1993 | Sakuta et al. ........................ 257/786 |
| 5,430,325 | * | 7/1995 | Sawada et al. ...................... 257/797 |

FOREIGN PATENT DOCUMENTS

| | | | |
|---|---|---|---|
| 51-17886 | * | 10/1976 | (JP) . |
| 2-12847 | * | 1/1990 | (JP) . |

* cited by examiner

Primary Examiner—Sara Crane

(57) ABSTRACT

A semiconductor integrated circuit for driving an LCD. The circuit has a shift register circuit portion (3) and a driver circuit portion (7). All the stages of the shift register circuit portion are formed adjacently to the outer fringe of a chip (30). All the stages of the driver circuit portion are formed along the central line ($L_1$) of the chip. Signal electrodes ($8_1$–$8_N$) for individual bits are formed in a belt-like region (33) extending in the X-direction along the central line ($L_1$) and adjacently to the driver circuit portion. Output electrodes are arranged in a zigzag fashion. Since the output electrodes overlap with each other in the Y-direction, the width of the chip can be suppressed. Power supply voltages ($V_H$, $V_0$, $V_2$, $V_3$, $V_5$) are applied to the driver circuit portion (7) through leads (36–40). These leads are connected so as to form a closed loop making one revolution around the output electrodes ($8_1$–$8_N$) located in the center of the chip. The leads do not intersect with each other, thus making the impedances of the leads uniform. As a result, the nonuniformity of the contrast of the display can be suppressed.

6 Claims, 10 Drawing Sheets

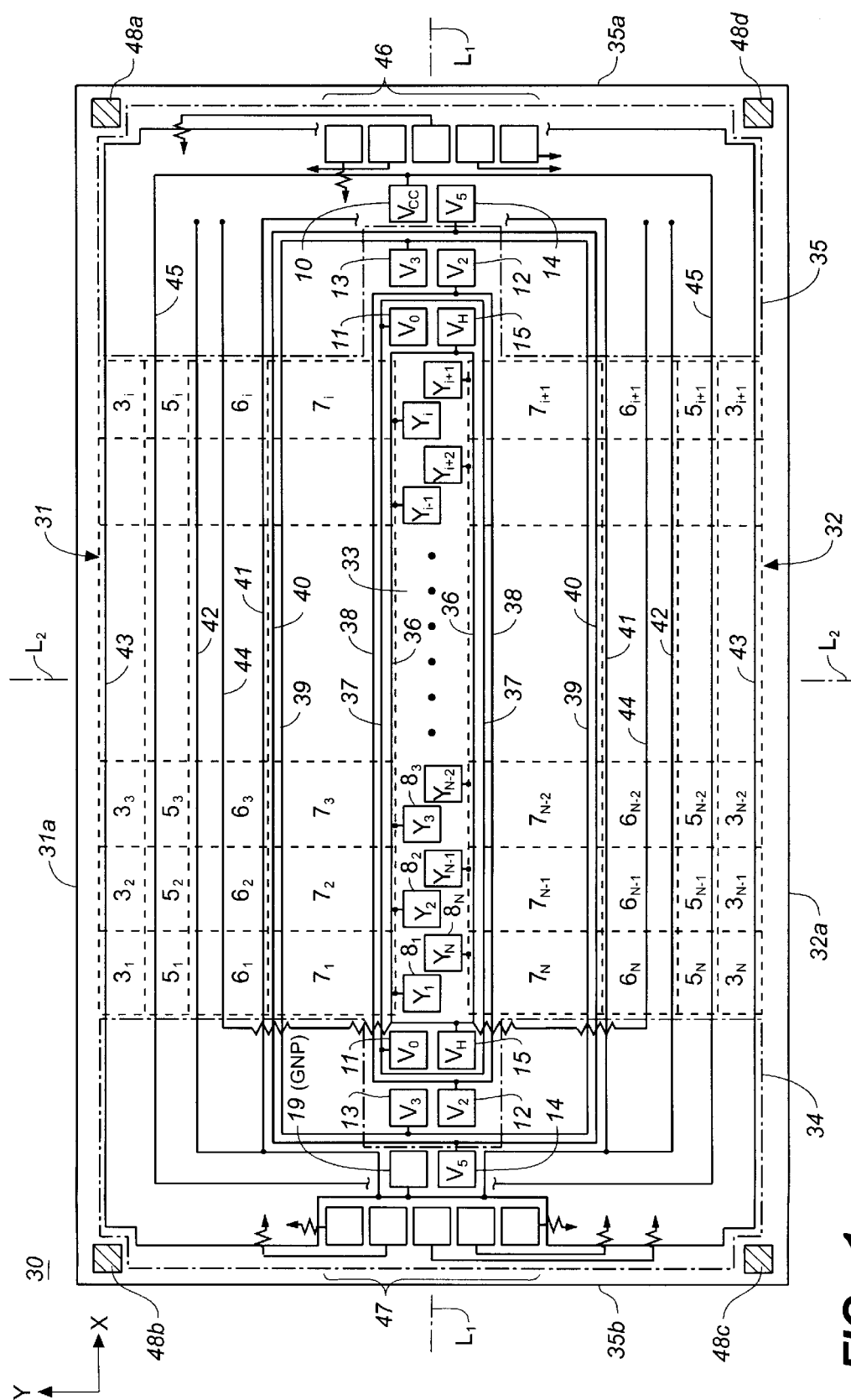
FIG._1

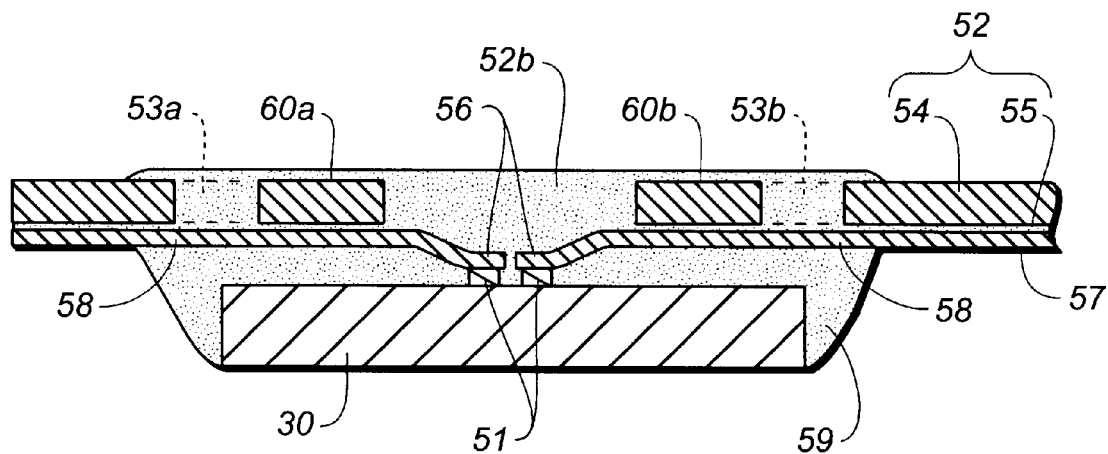
FIG._2
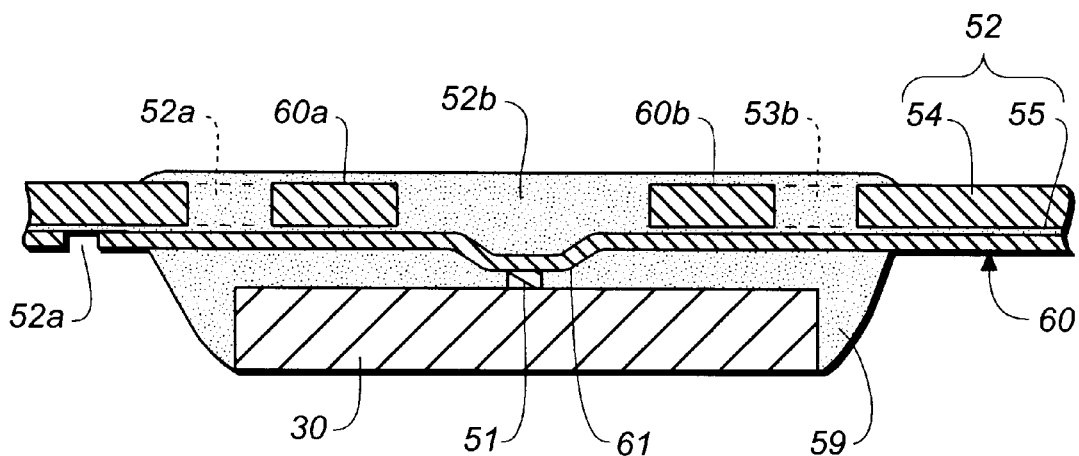
FIG._4

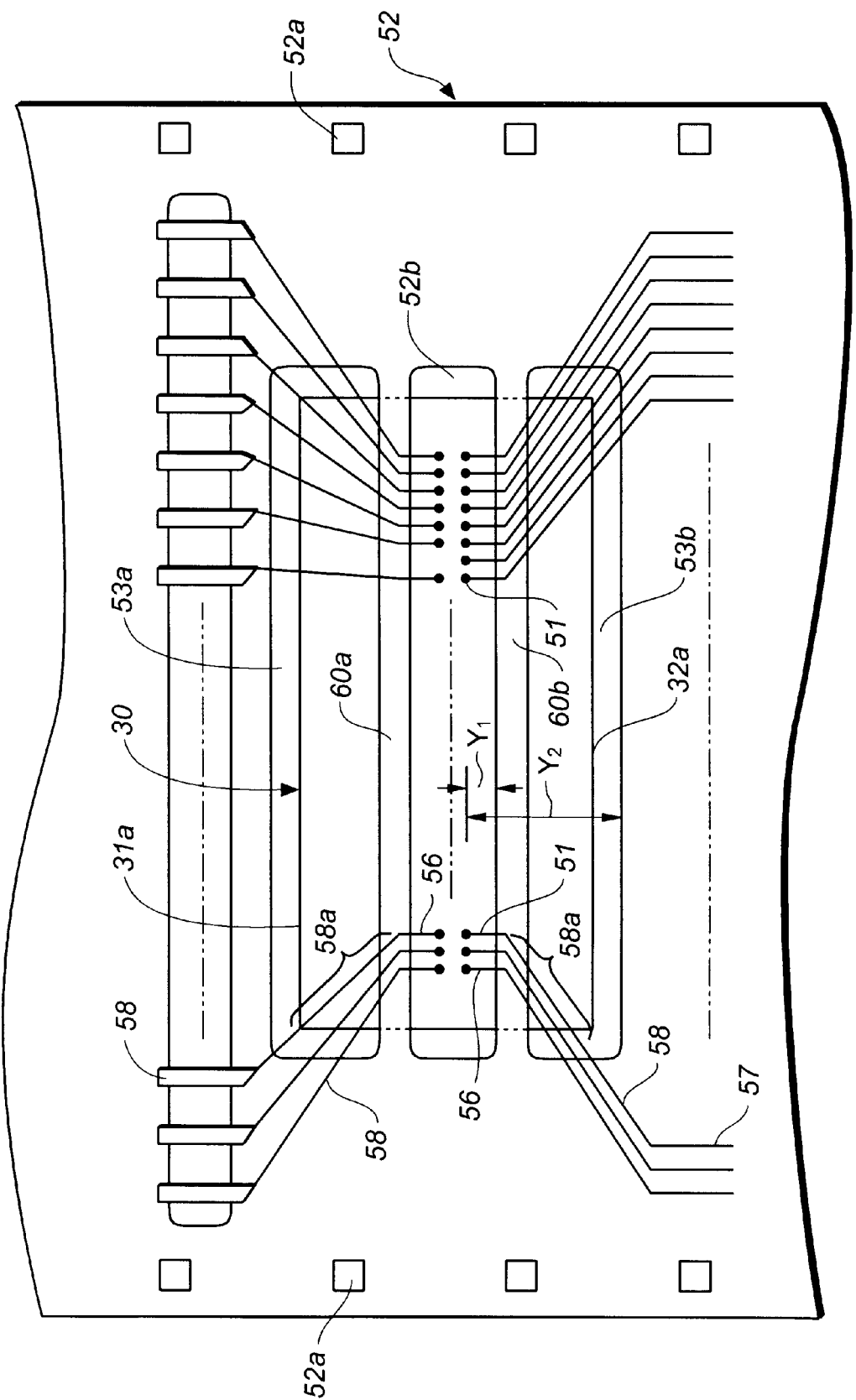
FIG._3

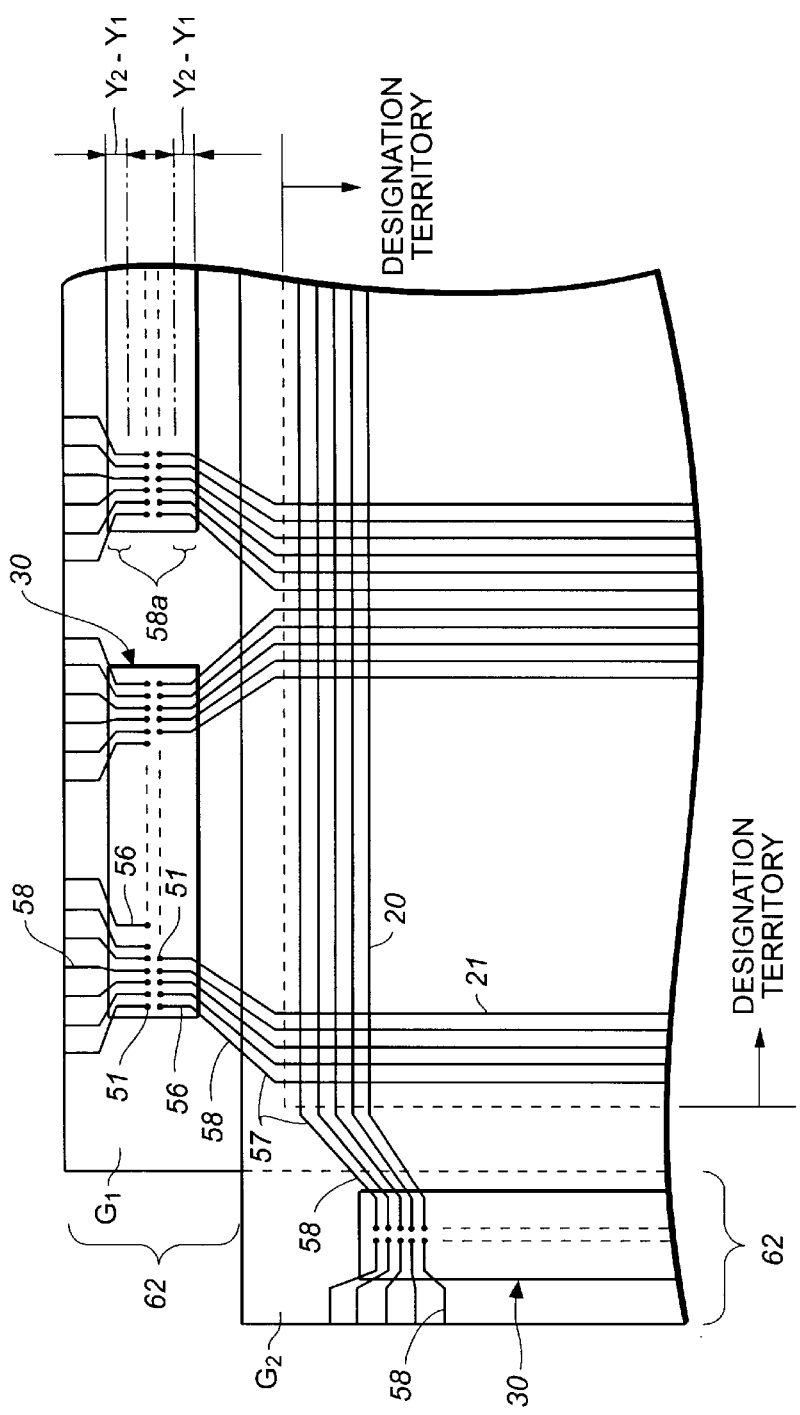
FIG._5A
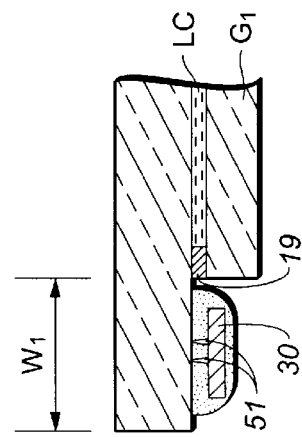
FIG._5B

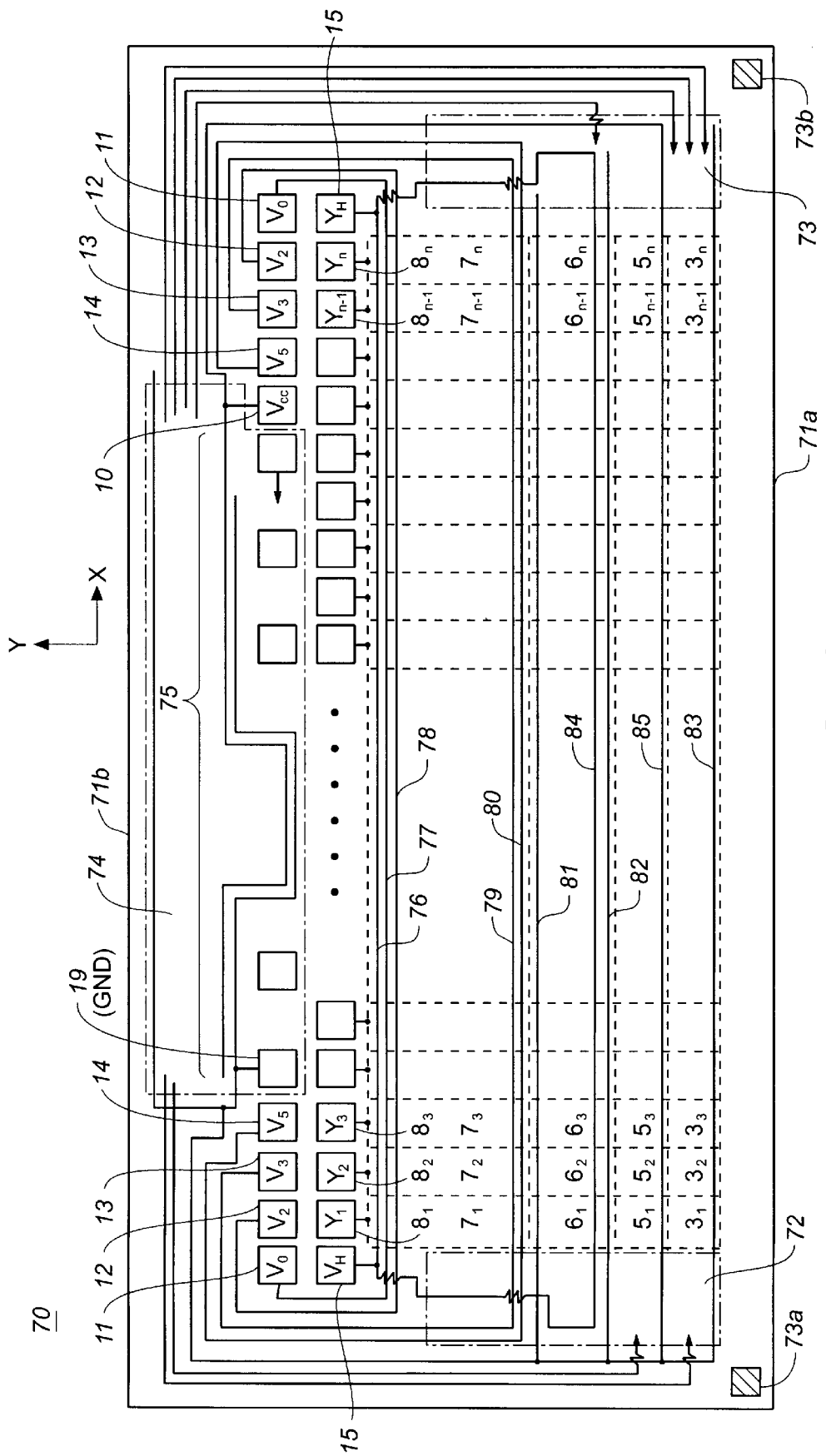
FIG._6

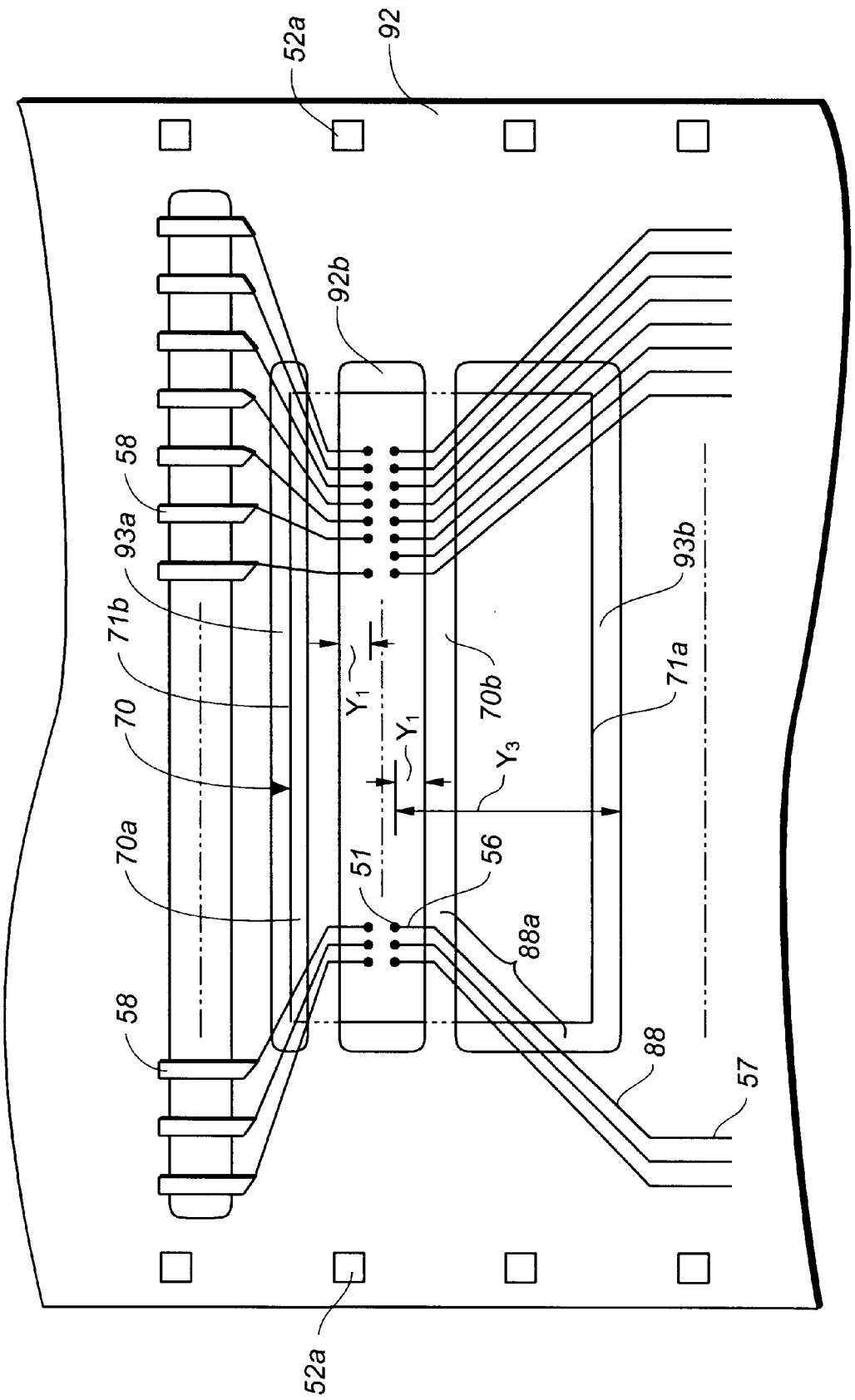
FIG._7

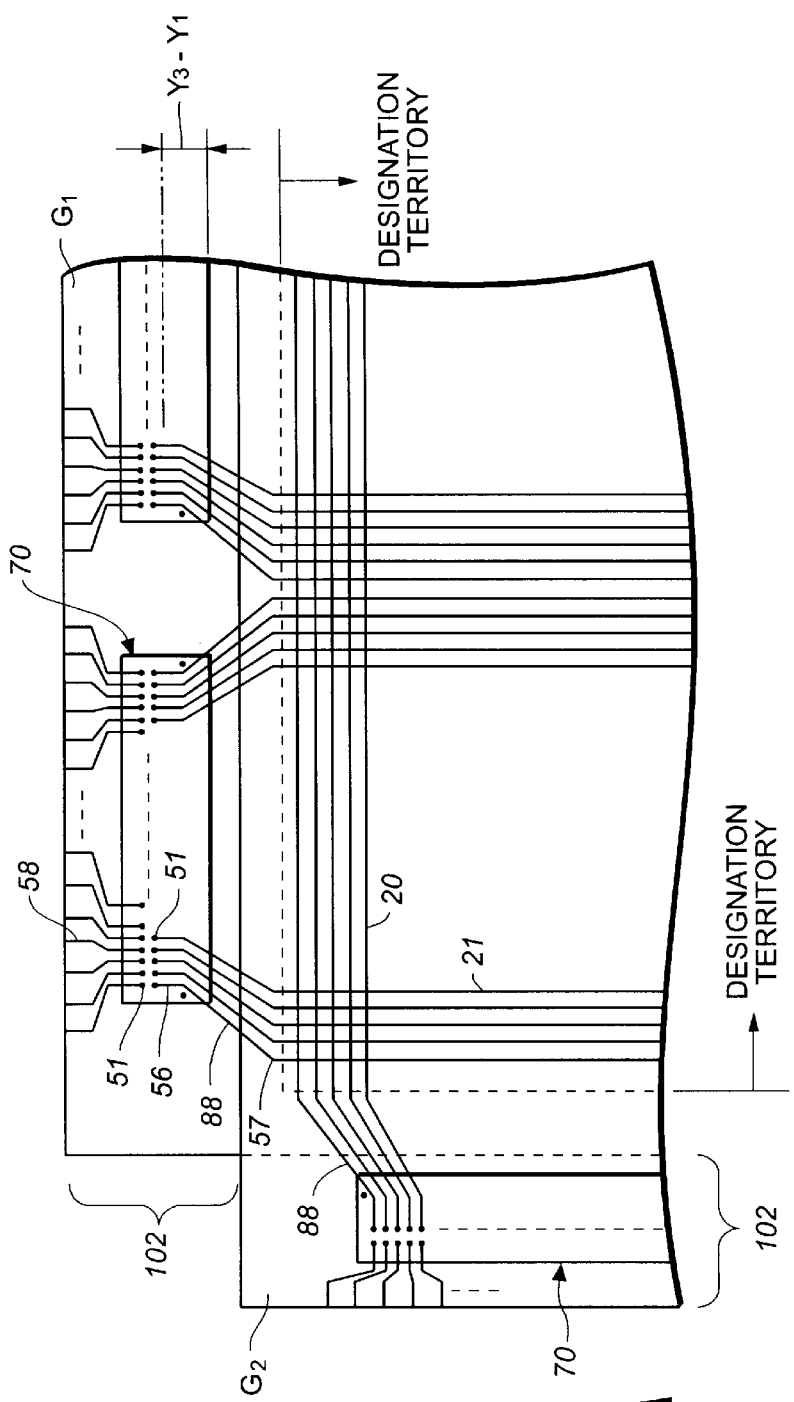
FIG._8A
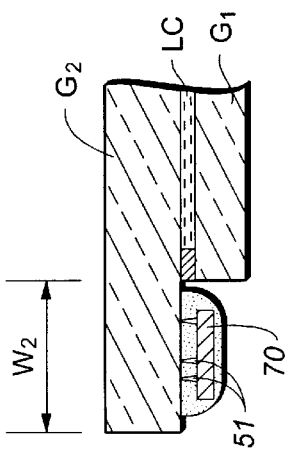
FIG._8B

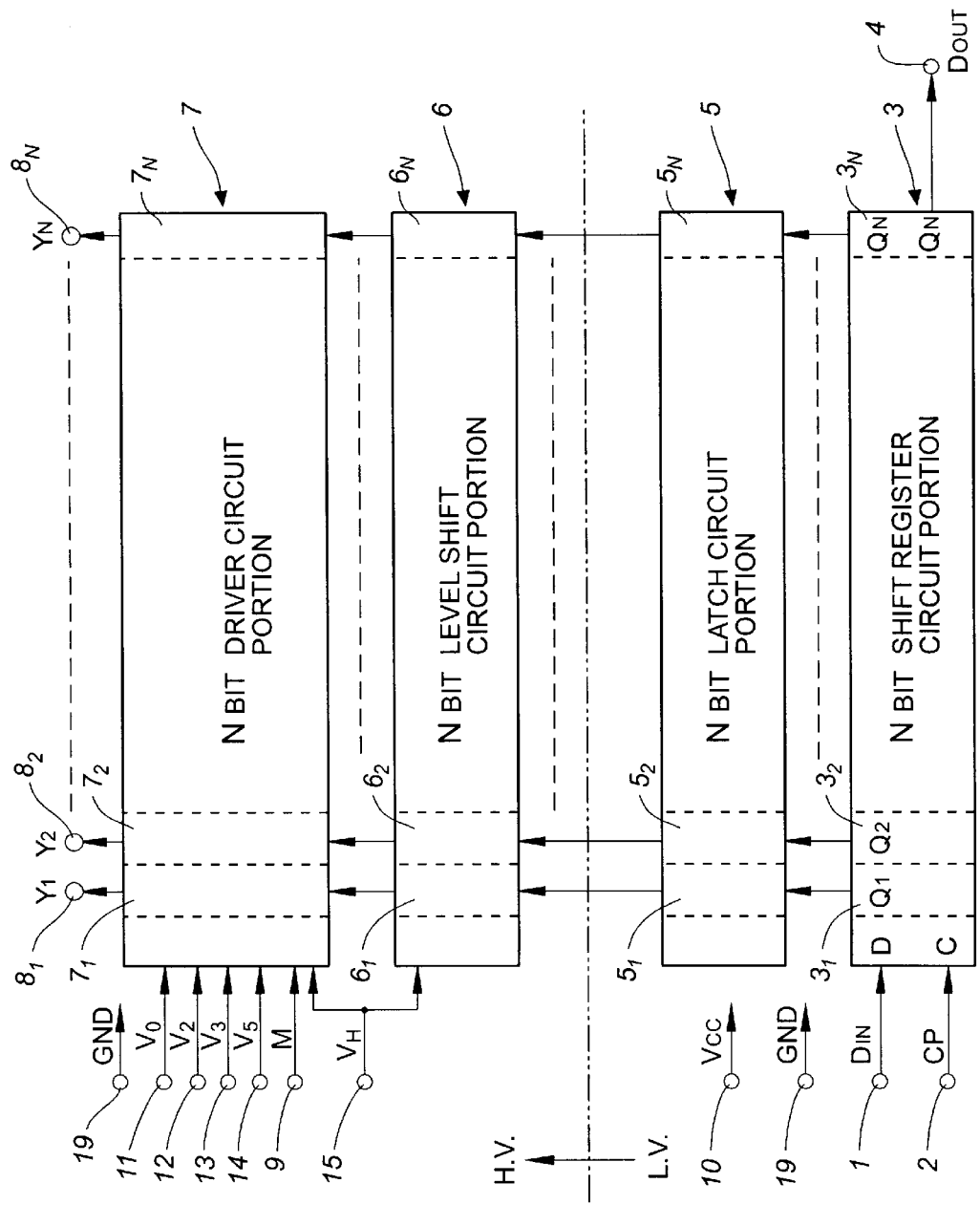
FIG._9

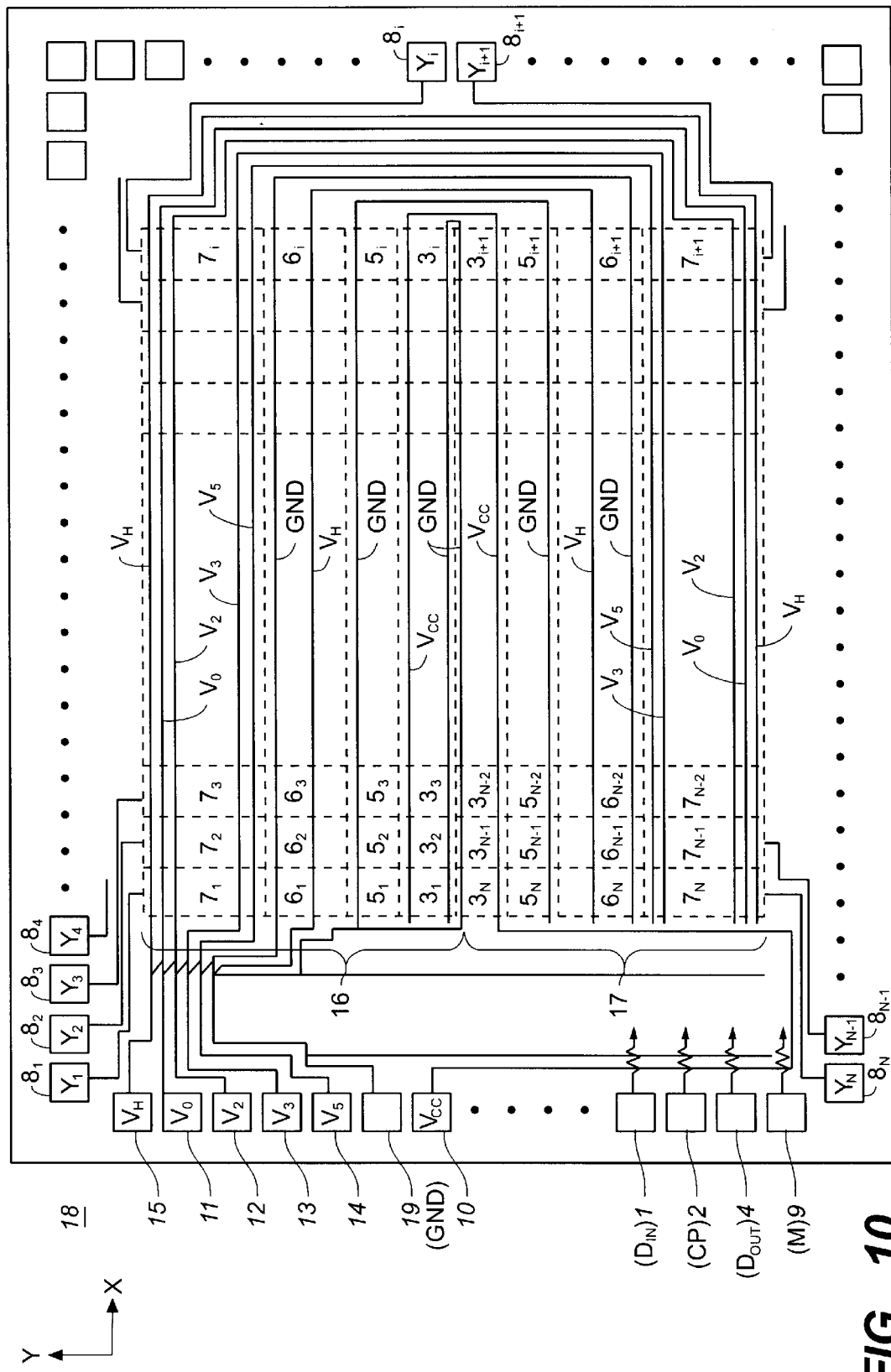
FIG._10

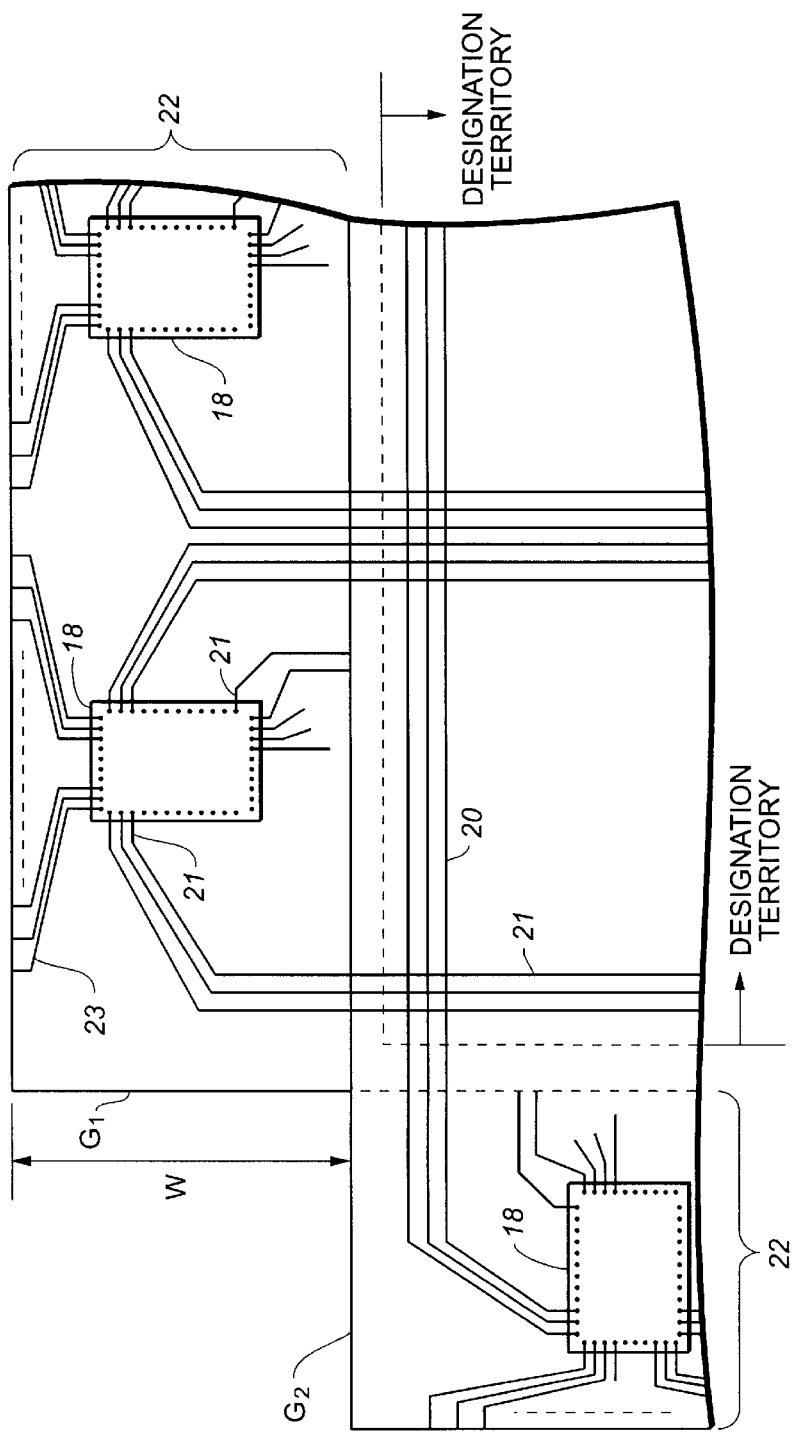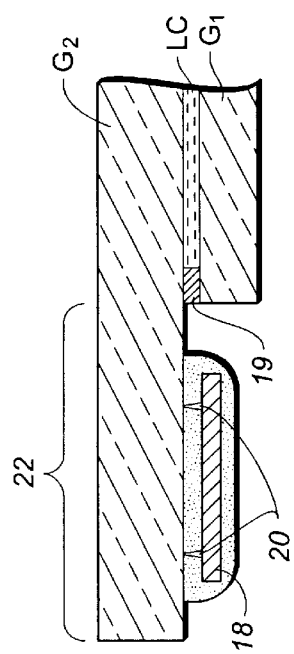
FIG._11A
FIG._11B

SEMICONDUCTOR DEVICE WITH CIRCUIT CELL ARRAY AND ARRANGEMENT ON A SEMICONDUCTOR CHIP

CROSS-REFERENCE TO RELATED APPLICATIONS

This is a division of application Ser. No. 08/359,339, filed on Dec. 19, 1994, now U.S. Pat. No. 5,585,666, which is a continuation of application Ser. No. 08/267,644 filed on Jun. 29, 1994, now abandoned, which is itself a continuation of application Ser. No. 07/778,853 filed on Dec. 23, 1991, also abandoned.

FIELD OF THE INVENTION

The present invention relates to a display driver integrated circuit or IC (such as an LCD driver), a multi-bit driver IC (such as a printer driver IC), a multiple input/output IC (such as a sensor interface IC), a gate array, and the like. More particularly, the present invention relates to a semiconductor device in which circuit cells of the same circuit configuration and input or output electrodes are arrayed in pairs. Also, the invention relates to a data input/output device using such a semiconductor device.

BACKGROUND OF THE INVENTION

The prior art common driver semiconductor integrated circuit for a liquid crystal display (LCD) is shown in FIG. 9 and comprises an N-bit shift register circuit portion 3 consisting of N stages, an N-bit latch circuit portion 5, an N-bit level shift circuit portion 6, and an N-bit driver circuit portion 7. A data signal input electrode 1 and a clock electrode 2 are connected with the shift register circuit portion 3. Data signals or display data signals $D_{IN}$ are applied to the shift register circuit portion 3 via the input electrode 1. Clock pulses CP are applied to the shift register circuit portion 3 via the clock electrode 2. The data signals $D_{IN}$ provided to the shift register circuit portion 3 via the input electrode 1 are transmitted from the first stage $3_1$ to the final stage $3_N$ serially every N clock pulses in synchronism with the clock pulses CP. The output $Q_N$ appearing at the final stage $3_N$ is supplied as output data signal $D_{OUT}$ to the next stage having a similar integrated circuit configuration via an external output electrode 4 for cascade connection.

The N-bit latch circuit portion 5 latches one row of data $(Q_1, Q_2, \ldots, Q_N)$ converted into a serial form by the shift register circuit portion 3. The level shift circuit portion 6 increases the output signals appearing at the individual stages of the latch circuit portion 5 from a logic voltage level of a low voltage of 3 to 5 volts to a higher voltage level for driving the LCD. The driver circuit portion 7 selects LCD driving power supply voltages $V_0, V_2, V_3, V_5$ in response to the outputs from the level shift circuit portion 6 in a 1:1 relation, shapes clock pulses M applied to an electrode 9 into AC driving waveform, and sends voltages $Y_1$–$Y_N$ to output electrodes $8_1$–$8_N$. In this integrated circuit, every stage has an identical in circuit configuration. The output electrodes, or pads, $8_1$–$8_N$ correspond to the stages in a 1:1 relationship. Since the N-bit shift register circuit portion 3 and the N-bit latch circuit portion 5 are driven by the low voltage $V_{CC}$ of the power supply voltage of 3 to 5 volts applied to an electrode 10, these stages a low voltage portion, L.V. On the other hand, a liquid crystal display requires liquid crystal driving voltages $V_0$ (e.g., about 38 V), $V_2$ (e.g., about 36 V), $V_3$ (e.g., about 2 V), and $V_5$ (e.g., about 0 V) be applied to the N-bit driver circuit portion 7 via electrodes 11, 12, 13, 14, respectively. Also, a high power supply voltage $V_H$ of about 40 V is applied to an electrode 15 which is connected with the level shift circuit portion 6 and also with the driver circuit portion 7. Therefore, the level shift circuit portion 6 and the driver circuit portion 7 form a high voltage portion, H.V.

Each one stage $3_i$ of the shift register circuit portion 3, each one stage $5_i$ of the latch circuit portion 5, each one stage $6_i$ of the shift level circuit portion 6, and each one stage 7 of the driver circuit portion 7 together form a cell. Each cell, consisting of shift register $3_i$, latch circuit $5_i$ and driver circuit $7_i$, and the corresponding output electrode $8_i$ are referred to hereinafter as a pair. A general chip layout of such pairs is shown in FIG. 10, where all the stages are arranged in a parallel array forming semiconductor chip 18. In this figure, the zigzag portions indicated by the solid lines indicate the positions at which conductive leads intersect with each other. As a whole, the cells and the electrodes are arranged symmetrically with respect to the central line of the chip extending in the X-direction. Specifically, the chip cell array is divided into a first block 16 and a second block 17. The stages $3_1$–$3_N$ of the shift register circuit portion are formed in the center of the chip. The stages $7_1$–$7_N$ of the driver circuit portion are formed on the outer fringe of the chip 18, or along the longer sides. The output electrodes $8_1$–$8_N$ are arranged on the outer side of the stages $7_1$–$7_N$ of the driver portion on the outer fringe of the chip. A conductive lead for a high voltage $V_H$ and conductive leads for liquid crystal driving power supply voltages $V_0, V_2, V_3, V_5$ extend from the pads across the first block 16 on the driver circuit portion 7 and on the level shift circuit portion 6 in the X-direction, extend in the direction opposite to the Y-direction, and then extend across the second block 17 in the direction opposite to the X-direction. A conductive lead for the low power supply voltage $V_{CC}$ extends from the corresponding pad across the first block 16 on the latch circuit portion 5 and on the shift register circuit portion 3 in the X-direction, extends in the direction opposite to the Y-direction, and extends across the second block 17 in the direction opposite to the X-direction.

The chip 18 of the LCD driving semiconductor integrated circuit of this layout is installed, for example, on a tape carrier or film by TAB (tape automated bonding). As shown in FIG. 11, the chip 18 can be directly installed on a liquid crystal panel. This is known as COG (chip on glass) techniques. In particular, the liquid crystal panel comprises a lower glass substrate $G_1$, an upper glass substrate $G_2$, a spacer 19 that maintains a spacing between the two substrates, and a liquid-crystalline material LC which occupies the space between the two glass substrates. Transparent row electrodes 20 and transparent column electrodes 21 are formed on the substrate. As shown in FIG. 11B, the chip 18 is directly bonded to the flat surface of a marginal region 22 of the glass substrate which forms a non-display region by the COG techniques. Bumps 24 are deposited on the electrodes, or pads, of the chip 18. The bumps 24 are bonded to the transparent row electrodes 20 or to the transparent column electrodes 21, for example, by thermocompression bonding or solder bonding to effect outer lead bonding. Conductive leads 23 extending to the fringe of the marginal region 22 form terminals for connection with a printed-wiring board (not shown).

In the chip 18, whose power supply leads are configured as described above, the leads for the power supply voltages $V_H, V_0, V_2, V_3, V_5, V_{CC}$ and a lead for grounding (GND) extend from the electrodes, or pads, formed in the marginal region of the chip, draw a U-shaped configuration or an open loop, as shown in FIG. 10, and terminate at the final stages $3_N$, $5_N$, $6_N$, $7_N$ of the second block. The voltages at the final stages of the second block tend to vary or be different from those voltages applied to the vicinities of the pads. This is due to the increased the lead lengths which translate to increased impedances of leads when approaching the final stages. In such a case, the lengths of the leads for the liquid crystal power supply, for example, are in excess of 10 mm. Even if the conductive leads are made of a metal, their resistance are generally tens of ohms. Fluctuations or variations in the power supply voltage applied to the final stages, as compared to the earlier stages, tend to cause a nonuniformity of the contrast of the liquid crystal display. Although it is possible to connect the leads at the final stages with the leads at the first stages so as to form a full loop without interrupting the power supply leads at the final stages by the multilayer interconnection techniques, the points at which the power supply leads intersect with each other and the points at which the power supply leads cross the signal leads increase in number. In such configurations, fabrication is more difficult and the quality of such circuits is degraded. Thus, it is inevitable that the impedance varies among the leads. As a result, the output characteristic of the driver circuit portion differs from display bit to display bit. Indeed, the leads can be made to form a loop, but the area occupied by the leads increases. Increasing the chip size increases the width W of the marginal region 22 in which the chip 18 is bonded as shown in FIG. 11. The liquid crystal display is preferred to have width W of the marginal region 22, comprising a non-display region, reduced to a minimum. In recent years, the liquid crystal display has tended to have increasingly finer picture elements. With this trend, the chip 18 has more and more display bits. Under these circumstances, the width W is required to be increased to accommodate more leads. Hence, the area occupied by the leads must be suppressed further to reduce the size of the display.

SUMMARY OF THE INVENTION

It is an object of this invention to provide a semiconductor device which comprises circuit cells and input or output electrodes arrayed in pairs, and has improved chip layout for suppressing variations in electrical lead impedance without increasing the space occupied by the leads, thereby making the input or output characteristic of the circuit cells and the corresponding display bits uniform. It is another object of the invention to provide a data input/output device having a narrower margin region on which a chip is installed.

In accordance with first aspect of this invention, a semiconductor device such as an IC for driving an LCD comprises an array of cells having substantially the same circuit configuration. In this type of semiconductor device, an electrode is provided for each cell for external electrical connection. In accordance with this aspect of the invention, the rows of the electrodes are formed on the inner side of marginal regions of a semiconductor chip, and that a circuit cell array is formed in the non-marginal regions located between the rows of the electrodes and the marginal regions of the semiconductor chip. The circuit cell array, forming the main portion of the chip circuitry, are not formed in the marginal regions of the semiconductor chip like in the prior art techniques. In this layout, i.e., the rows of the electrodes are disposed in the central region of the chip so that the chip can be fabricated to have a narrower width than previously possible. Also, when the leads are installed and bonded to the electrodes, short circuiting at the edge of the chip can be prevented. Where the semiconductor chip is bonded by TAB, it is desired to connect the inner leads to the chip electrodes from a remote side of the chip, which are substantially parallel to the rows of the electrodes, to increase the lengths of the portions of the inner leads that over lie the chip. When the chip is bonded to a substrate of the device, outer leads are connected from the inner leads via extended lead portions with electrodes formed on the substrate. The presence of the overlying portions can reduce the dense region or the occupied width on the substrate.

In accordance with second aspect of the present invention, a semiconductor device has a circuit cell array divided into two or more blocks, the electrodes for the cells are divided into a first electrode row belonging to the first block and a second electrode row belonging to the second block. In accordance with this invention, the circuit cell array of the first block is formed in a first non-marginal region between a first longer side of the semiconductor chip and a first electrode row formed in a central region of the chip. The second circuit cell array of the second block is formed in a second non-marginal region between the second longer side, opposite to the first longer side, and the second electrode row formed in the central region of the chip. This layout of the semiconductor device permits the lengths of portions of the inner leads, which overlie the chip, to be increased. As a result of this construction, the above mentioned advantages can be achieved. Preferably, both rows of electrodes are disposed adjacently to each other, but it is not always necessary that both rows be neatly aligned. As an example, where both rows of electrodes are arranged in a zigzag fashion, the chip width can be reduced. Also, the width of the surface to which the chip is bonded can be decreased. Preferably, power supply electrodes and a grounding electrode are formed adjacent to, and on the outer ends of or at one end of the longitudinal extent of the electrode rows in the central region of the circuit cell array. In the chip having the electrodes arranged in lines in this manner, conductive leads for the power supply electrodes and the grounding electrode are arranged forming concentric, closed loop lead lines, i.e., circular-shaped connections are made. Reductions in the lengths of the leads and a reduction in the number of the intersections of the leads can be simultaneously attained. Consequently, the input or output characteristics can be made substantially more consistent among display bits so that there is less difference in contrast among the display bits. Furthermore, where a row of input/output electrodes for making external electrical connections is formed along one shorter side of the semiconductor chip adjacent to the power supply electrodes and the grounding electrode, all the electrodes form a substantially I-shaped arrangement. When the chip is directly installed via TAB, the inner lead ends of the lead pattern are automatically made parallel to the chip electrodes or pads due to this I-shaped arrangement. Where the chip electrodes are connected with the inner leads, it is desired that each inner lead be either supported at both ends to the electrodes for the circuit cells or suspended at both ends from these electrodes. The straight arrangement of the electrodes makes it easy to arrange the chip parallel when batch bonding is performed. In accordance with this aspect of the present invention, a decrease in the stress can also be expected. This improves the alignment which, in turn, enhances the yield of batch bonding. The surface of the chip is coated and protected by the inner leads and, therefore, the active surface of the chip is prevented from being damaged and scratched during the bonding process. As a result of such construction, the heat-dissipating characteristics are improved. By mounting the chip having the leads, as described above, on a substrate of a LCD panel by the method described above, the width of the driver chip region on the marginal edge of the substrate can be reduced and the LCD panel can be made of more compact size.

BRIEF DESCRIPTION OF THE DRAWINGS

In the drawings, wherein like reference characters denote similar elements throughout the several views:

FIG. 1 is a circuit diagram of a semiconductor device which is used to drive a liquid crystal and takes the form of a chip, the device being fabricated in accordance with the invention;

FIG. 2 is a cross-sectional view of the chip shown in FIG. 1, the chip being bonded according to the TAB method of FIG. 2;

FIG. 3 is a plan view of the chip shown in FIG. 1, the chip being bonded by said one TAB method;

FIG. 4 is a view similar to FIG. 2, but in which the chip is bonded by another TAB method;

FIG. 5A is a plan view of the chip shown in FIG. 4, the chip being installed in the marginal region of a liquid crystal panel by COG techniques;

FIG. 5B is a cross-sectional view of the marginal region of the liquid crystal display shown in FIG. 5A;

FIG. 6 is a circuit diagram of another semiconductor device which is used to drive a liquid crystal and takes the form of a chip, the device being fabricated in accordance with the invention;

FIG. 7 is a cross-sectional view of the chip shown in FIG. 6, and in which the chip is bonded by TAB;

FIG. 8A is a plan view of the chip shown in FIG. 7, the chip being installed in the marginal region of a liquid crystal panel by COG techniques;

FIG. 8B is a cross-sectional view of the marginal region of the liquid crystal display shown in FIG. 8A;

FIG. 9 is a block diagram of a general circuit configuration of a semiconductor device for driving a liquid crystal;

FIG. 10 is a circuit diagram of the prior art semiconductor device which is used to drive a liquid crystal and takes the form of a chip;

FIG. 11A is a plan view of the chip shown in FIG. 10, the chip being installed in the marginal region of a liquid crystal panel by COG techniques; and FIG. 11B is a cross-sectional view of the marginal region of the liquid crystal display shown in FIG. 11(A).

DETAILED DESCRIPTION OF PREFERRED EMBODIMENTS

The preferred embodiments of a semiconductor device according to the invention are hereinafter described by referring to the accompanying drawings.

EMBODIMENT 1

Referring to FIG. 1, there is shown the layout of a semiconductor device taking the form of a chip, the device being fabricated in accordance with the invention. The Zigzag portions indicated by the solid lines indicate the intersections of conductive leads. This semiconductor chip, indicated by reference numeral 30, is an IC for driving an LCD. This chip 30 assumes the form of a rectangle or elongated to suppress the width of the marginal region when the chip is bonded by the COG (chip on glass) techniques. An integrated circuit fabricated on this chip 30 consists principally of an N-bit (e.g., 100 bits) shift register circuit portion 3, a latch circuit portion 5, a level shift circuit portion 6, and a driver circuit portion 7, in the same way as the prior art integrated circuit.

Rectangular output electrodes (or pads) $8_1$ to $8_N$ producing their respective driver outputs $Y_1$ to $Y_N$ are formed at the individual stages of the circuit cell array immediately adjacently to the stages $7_1$ to $7_N$ of the driver circuit portion 7.

The circuit cell array is divided into a first block 31 and a second block 32. Specifically, the array is divided into these two blocks 31 and 32 substantially symmetrically with respect to the central horizontal line $L_1$ parallel to the longer sides 31a and 32a of the chip. Cells 1 to i define the first block 31, and cells i+1 to N, where N is an even number, define the second block 32. Preferably, all the cells are substantially identical in area. The cell of the first bit and the cell of the Nth bit are arranged facing each other on the opposite sides of the central line $L_1$. The cell of the second bit and the cell of the (N−1)th bit are arranged facing each other on the opposite sides of the central line $L_1$, and so on, so that corresponding cells of adjacent stages in blocks 31 and 32 form pairs of column aligned stage cells.

The stages of the shift register circuit portion 3 are formed in the marginal region of the chip 30, while the stages of the driver circuit portion 7 are formed on the side of the central line $L_1$ of the chip, in a just opposite relation to the arrangement of the prior art chip. Therefore, signal electrodes $8_1$–$8_N$ of the various bits are formed in a belt-like region or central region 33 extending in the X-direction along the central line $L_1$ adjacent to the driver circuit portion. The output electrodes $8_1$–$8_i$ of the bits belonging to the first block 31 are disposed in a staggered relation to the output electrodes $8_{i+1}$–$8_N$ of the bits belonging to the second block 32. That is, these output electrodes are arranged in a zigzag fashion. Since the neighboring output electrodes $8_i$ and $8_{i+1}$ overlap with each other, the width of the chip, or the dimension taken in the Y-direction, can be suppressed. No electrodes (or pads) are formed between the shift register circuit portion 3 and the longer sides 31a and 32a of the chip, so that the shift register circuit portion 3 can be arranged as close as possible to the longer sides 31a and 32a. This also enables a reduction in the width of the chip. Of course, this results in an increase in the length of the chip, or the dimension taken in the X-direction, but this increase is advantageous to the implementation of the COG techniques as described later, because the pixels of the LCD are sufficiently large compared with the pitch (about 80 microns) between the successive output electrodes $8_1$–$8_N$.

Control logic portions 34 and 35 are formed in the regions surrounded by the dot-and-dash lines in FIG. 1 on the outer side of both ends of the circuit cell array. Rectangular power supply electrodes 10–15 and a rectangular grounding electrode 19 are formed on the outer sides of both ends of the belt-like region 33 which extends along the central line $L_1$, the output electrodes $8_1$–$8_N$ being formed in the belt-like region. The dimension of the electrode region taken in the X-direction is substantially equal to the width of the belt-like region 33. One of the electrode regions has four electrodes or pads arranged in two rows and two columns, and the other electrode region has two electrodes or pads arranged in one row. The power supply electrodes 10–15 and the grounding electrode 19 are arranged symmetrically with respect to the central line $L_2$ parallel to the shorter sides 35a and 35b. As shown in FIG. 1, the row closer to the central vertical line $L_2$ consists of the electrode 11 for liquid crystal driving power supply voltage $V_0$ and the electrodes 15 for the power supply voltage $V_H$ supplied to a high voltage power supply portion. The adjacent intermediate row consists of the electrode 13 for liquid crystal driving power supply voltage $V_3$ and the electrodes 12 for liquid crystal driving power supply voltage $V_2$. The outermost row shown at the left side of FIG. 1 consists of the grounding electrode 19 (GND) and the electrodes 14 for liquid crystal driving power supply voltage $V_5$. The outermost row shown at the right side of FIG. 1 is composed of the electrode 10 for the power supply voltage $V_{CC}$ applied to a low power supply portion and the electrode 14 for liquid crystal driving power supply voltage $V_5$. Power supply leads 36 made of aluminum which are connected with the electrodes 15 for the high power supply voltage $V_H$ pass around adjacent to the belt-like region 33. These power supply leads 36 supply electricity to the driver circuit portion 7 that is the high voltage portion. One electrode 15 may be omitted, but it can be used where a cascade connection is made to a similar chip.

Similarly, power supply leads 37 which are connected with the electrodes 11 for the liquid crystal driving power supply voltage $V_0$ pass around the power supply leads 36 adjacently to them, the leads 36 being connected so as to form a closed loop or a ring. The power supply leads 37 supply electricity to the driver circuit portion 7 that is, the high voltage portion. One electrode 11 may be omitted, but it can be employed where a cascade connection is made to a similar chip. Likewise, power supply leads 38 connected with both electrodes 12 for the liquid crystal driving power supply voltage $V_2$ pass around the power supply leads 37 adjacently to them, the leads 37 being connected so as to form a closed loop. The power supply leads 38 also serve to supply power to the driver circuit portion 7, via lines 44, which is the high voltage portion. One electrode 12 is used for cascade connection. Power supply leads 39 connected with the electrodes 13 for the liquid crystal driving power supply voltage $V_3$ pass around the power supply leads 38 which are connected so as to form a closed loop. The leads 38 are laid on the driver circuit portion 7 and close to the level shift circuit portion 6, and act to supply electric power to the driver circuit portion 7. One electrode 13 is used for cascade connection. Power supply leads 40 pass around the power supply leads 39 adjacently to them, the leads 39 are arranged to form a closed loop. The leads 40 supply electric power to the driver circuit portion 7. One electrode 14 is used for making a cascade connection.

The power supply leads 36, 37, 38, 39, and 40 for applying the power supply voltages $V_H$, $V_0$, $V_2$, $V_3$, $V_5$ to the driver circuit portion 7 are so connected as to form a closed loop which makes one revolution around the output electrodes $8_1$–$8_N$ formed in the center of the chip. Therefore, these leads do not intersect with each other and, as such, the impedance of each lead is substantially uniform. Hence, a display having more uniform contrast than conventionally possible is provided by this arrangement. In other words, nonuniformity of the contrast of display can be suppressed. As can be seen by comparison with the arrangement of the U-shaped leads shown in FIG. 10, the power supply leads are shortened, because they pass around the belt-like region 33 adjacent to it, the belt-like region being located along the central line $L_1$ through the chip. In particular, the dimension taken in the Y-direction is reduced greatly. Reductions in the resistances of the leads suppress fluctuations and variations in the power supply voltages for individual display bits. This also contributes to an improvement in the contrast of display.

The grounding lead which is connected with the grounding electrode 19 (GND) separates into three leads for the first block 31 and into three leads for the second block 32. The inner grounding leads 41 are disposed at the boundary between the driver circuit portion 7 and the level shift circuit portion 6. The intermediate grounding leads 42 are arranged at the boundary between the level shift circuit portion 6 and the latch circuit portion 5. The outer grounding leads 43 are arranged on the outer sides of the shift register circuit portion 3. The outer power supply leads 44 which branch from the power supply leads 36 for the power supply voltage $V_H$ in the first block 31 and the second block 32, respectively, are arranged on the level shift circuit portion 6. The power supply leads 45 connected with the electrode 10 for the low voltage power supply $V_{CC}$ are arranged at the boundary between the latch circuit portion 5 and the shift register circuit portion 3. Although the grounding leads 41, 42, 43, the branched power supply leads 44, and the ordinary power supply leads 45 can be connected so as to form a closed loop lead circuit, an open loop is formed in the present embodiment in the same manner as in the prior art techniques since the display characteristics are not affected by this formed loop.

The low power supply voltage $V_{CC}$ and the grounding voltage GND are also supplied to the logic control portions 35 and 36. Rows of input and output signal electrodes 46 and 47 for receiving and delivering requisite input and output signals, such as data signal $D_{IN}$, output data $D_{OUT}$, clock pulses CP, and AC waveform M transformed from the clock pulses, are formed around the centers of the shorter sides 35a and 35b, respectively, of the chip. The electrodes $8_1$–$8_N$, 10–15, 19 disposed along the central horizontal line $L_1$ together with the rows of the electrodes 46, 47 for the input and output signals form an I-shaped configuration, the rows of electrodes 46, 47 being perpendicular to the arrangement of electrodes $8_1$–$8_N$, 10–15, 19 formed between them. In the circuit layout where the chip is divided into the first block 31 and the second block 32 on the opposite sides of the central line $L_1$, both blocks are treated equally. Therefore, it is desired to allocate the input and output signal electrodes equally to both blocks which are on the opposite sides of the central horizontal line $L_1$. In this case, the layout of the signal leads is made symmetrical, and the leads have the same length. The I-shaped configuration of the electrodes is advantageous in installing the chip directly on a substrate by means of COG techniques as will be described later. The presence of the input and output signal electrodes 46 and 47 perpendicular to the straight rows of electrodes disposed along the central line $L_1$ makes it easier to render the chip itself parallel in mounting it by using COG techniques. This paralleling step does not rely only on the electrode rows 46 and 47 arranged on opposite sides of the straight rows of electrodes, but as the length of the chip, or the dimension taken in the X-direction, is made longer, which is of important significance. In the present embodiment, locating and supporting dummy electrodes or pads 48a–48d are formed at the four corners of chip 30. As used herein, the term, "dummy electrodes", is intended to refer to those electrodes which are not in electrical contact with other portions of the chip. In the prior art configuration of FIG. 10, driver output signal electrodes are formed at the corners of the chip to increase the number of the bits. Therefore, if dummy electrodes are formed, then problems will exist since driver output signal electrodes are arranged at those corners. However, in the present embodiment, the driver output signal electrodes are formed in the belt-like region 33 along the central line $L_1$.

In addition, the rows of the input and output electrodes are disposed on the opposite sides 35a and 35b of the array of the driver output signal electrodes. Hence, the dummy electrodes 48a–48d are preferably formed at the chip corners.

FIG. 2 is a cross-sectional view of a chip according to the present invention, and in which the chip is bonded by TAB (tape automated bonding). FIG. 3 is a plan view of TAB chip 30. Chip 30 having the above-described layout is at the stage of a wafer which has passed through a diffusion step. Bumps 51 preferably comprising gold are then formed on the electrodes or pads. After completing the wafer having the bumps 51, the wafer is then cut or diced into chips. Meanwhile, a tape carrier 52 used for the assembly step consists of a plastic film 54 such as polyimide film. A lead pattern corresponding to the arrangement of the electrodes on the chip 30 is formed on the film having sprocket holes 52a and a device lead hole 52b. The area of the opening in the device lead hole 52b is smaller than the area of the flat surface of the chip 30. It substantially follows that the bumps 51 such as the output electrodes $8_1$–$8_N$ formed in the belt-like portion in the center of the chip 30 are exposed only on the flat surface. The tape carrier 52 has slits 53a and 53b outside the device lead hole 52b to permit passage of molten resin. The carrier 52 is the plastic film 54 on which a layer of adhesive 55 is coated. That is, the carrier consists of a two-layer tape. A foil of a metal such as copper is formed on this film 54, and the lead pattern shown in FIG. 3 is formed by using photoresist and etching techniques. This lead pattern protrudes or extends into the device lead hole 52b, and comprises the bumps 51, finger leads or inner leads 56 to be bonded, outer leads 57 to be bonded to the row or column electrodes on the LCD panel, and extended lead portions 58 for connecting together the finger leads 56 and the outer leads 57. Terminals are formed at the front ends of the extended lead portions 58 which are connected with the face of the film 52 on the side of the printed-wiring board. The tape carrier 52 fabricated in this way and the chip 30 having the above-described bumps are assembled by TAB (tape automated bonding). Specifically, the tape is supplied, and at the same time, the chip 30 which is facing up, is aligned with the finger leads 56. The finger leads 56 and the bumps 51 are subjected to inner lead bonding using a bonding tool. Then, the chip 30 is sealed with a molding resin 59 by potting equipment. Since the film 52 itself has the slits 53a and 53b disposed outside the device lead hole 52b to permit passage of the resin during the potting process, the whole surface of the chip 30 can be sealed without producing corners. Of course, it is possible to remove any portion that is not sealed with the molding resin, by setting the area of the opening in the device lead hole 52b larger than the area of the chip 30. In the present embodiment, the film ribs 60a and 60b are formed between the device lead hole 52b in the film 52 and the slits 53a and 53b, and the latter slits permit the passage of resin during the molding operation to reinforce the back surfaces of the exposed leads. The film ribs 60a and 60b are substantially near the bumps 51 on the chip 30 so that the length of the cantilevered, or protruding portions of the finger leads 56 is $Y_1$. Where neither the film ribs 60a nor 60b exist relative to the leads, the length of the cantilevered portions is $Y_2$. In the preferred embodiment, $Y_1<Y_2$. It substantially follows that the length of the cantilevered portions is reduced by $Y_2-Y_1$. As the finger leads 56 are made shorter, the alignment can be effected with greater ease during the inner lead bonding. As such, the chip is supported with greater stability and strength. Furthermore, the bumps 51 are arranged in lines. This arrangement improves the alignment during batch bonding. The bonding can be performed successfully even if the chip is large. Since the inner leads cover substantially the whole surface of the chip, the chip surface can be prevented from being scratched by the batch bonding tool. If the bumps are spaced very close to each other, e.g., the pitch between the successive bumps is less than 100 microns, batch bonding is possible. Further, the finger leads 56 do not easily come into contact with the edge of the chip 30, because the shortened finger leads 56 flex to a lesser extent and because the bumps 51 or the electrodes (or pads) are formed in the center of the chip 30. In consequence, edge shorting of the leads to the chip can be prevented. This eliminates the possibility that the leads are in contact with the edge of the chip by the weight of the molding resin 59. Where none of the film ribs 60a and 60b exist, the alignment of the finger leads 56 with the bumps 51 is not facilitated, but an insulating layer can be formed on the finger leads 56 close to the chip edge, since the bumps 51 are not formed near the chip edge. Also in this case, edge shorting can be circumvented, and the inner leads that cover the surface of the chip improves the heat dissipating characteristics.

FIG. 4 is a cross-sectional view of the above-described chip bonded by another process of TAB (tape automated bonding). In TAB chip 60, the inner leads 61 protruding over the device lead hole 52b are continuous and are supported at opposite ends to the film 54. Since the bumps 51 exist in the center of the chip 30, it is not necessary that the inner leads be cantilevered. Where the inner leads are supported at both ends in this way or both ends are suspended, the accuracy of the alignment with the bumps 51 is improved over the cantilevered structure shown in FIG. 3. In this manner, the strength by which the inner leads are supported is doubled. Of course, the tendency of a short circuit is significantly reduced and is not likely to occur at the edge of the chip. Another advantage is that the chip surface is prevented from becoming scratched. A chip so fabricated has excellent heat-dissipating characteristic.

FIG. 5A is a plan view of a chip installed in the marginal region 62 of a liquid crystal panel by the COG techniques. Of the leads from the panel, the extended lead portions 58 lie on the flat surface of the chip 30. Generally, the extended lead portions 58 must accommodate the pitch between the successive bumps 51. Then, the extended lead portions 58 are required to adapt themselves gradually to the wider spacing between the rows or columns of pixels. As the pitch between the successive bumps 51 loop. The power supply leads 38 also serve to feed electricity to the driver circuit portion 7 that is the high voltage portion. One electrode 12 is used for cascade connection. Power supply leads 39 connected with the electrodes 13 for the liquid crystal driving power supply voltage V, pass around the power supply leads 38 which are connected so as to form a closed loop. The leads 38 are laid on the driver circuit portion 7 and close to the level shift circuit portion 6, and act to feed electric power to the driver circuit portion 7. One electrode 13 is used for cascade connection. Power supply leads 40 pass around the power supply leads 39 adjacently to them, the leads 39 being connected so as to form a closed loop. The leads 40 supply electric power to the driver circuit portion 7. One electrode 14 is used for making a cascade connection.

The power supply leads 36, 37, 38, 39, and 40 for applying the power supply voltages $V_H$, $V_0$, $V_2$, $V_3$, $V_5$ to the driver circuit portion 7 are so connected as to form a closed loop which makes one revolution around the output electrodes $8_1$–$8_N$ formed in the center of the chip. Therefore, these leads do not intersect with each other. This makes the impedance of each lead uniform. Hence, nonuniformity of the contrast of display can be suppressed. As can be seen by comparison with the arrangement of leads shown in FIG. 10, the power supply leads are shortened, because they pass around (chip on glass) techniques. An integrated circuit formed on chip 70 consists principally of an N-bit shift register circuit portion 3, a latch circuit portion 5, a level shift circuit portion 6, and a driver circuit portion 7, in the same manner as shown in Embodiment 1. Rectangular output electrodes or pads $8_1$–$8_N$ providing their respective driver outputs $Y_1$–$Y_N$ are formed at the individual stages of the circuit cell array of only one block, these electrodes being located immediately adjacently to the stages $7_1$–$7_N$ of the driver circuit portion 7. The n-bit shift register circuit portion 3 is formed along one longer side 71a of chip 70. The output electrodes or pads $8_1$–$8_N$ are linearly arranged in the X-direction.

Control logic portions 72 and 73 are formed in the region surrounded by the dot-and-dash line in FIG. 6 on the outer sides of both ends of the region 70a in which the cell array is formed. Also, a control logic portion 74 indicated by the dot-and-dash line is formed beside the center of the other longer side 71b. A row of electrodes 75 for requisite input and output signals, such as data signal $D_{IN}$, output data $D_{OUT}$, clock pulses CP, and AC waveform M, disposed out of the clock pulses, is arranged in the X-direction on the inner side of the control logic portion 74. This row is parallel and adjacent to the row of the output electrodes $8_1$–$8_N$. Rectangular power supply electrodes 11–14, a rectangular grounding electrode 19 (GND), and a low voltage power supply electrode 10 are formed on the outer side of both ends of the row 75. High voltage power supply electrodes 15 are formed on the outer side of both ends of the row of output electrodes $8_1$–$8_N$. Thus, two rows of electrodes are formed on the chip in the X-direction. A power supply lead 76 connected with both electrodes 15 for high power supply voltage $V_H$ is close to the row of output electrodes $8_1$–$8_N$. Electric power is supplied to the driver circuit portion 7, which is a high voltage portion, through the leads 76. One of the two opposite electrodes 15 can be omitted. However, this electrode is utilized where a cascade connection is made to an adjacent similar chip, it is utilized. Similarly, a power supply lead 77 connected with both electrodes 11 for liquid crystal driving power supply voltage $V_0$ is adjacent to the power supply leads 76 parallel with the longer side 71a. Electric power is supplied to the driver circuit portion 7, that is the high voltage portion, through the lead. Although one of the electrodes 11 can be omitted, it is used to make a cascade connection with an adjacent similar chip. A power supply lead 78 is connected with both electrodes 12 for liquid crystal driving power supply voltage $V_2$ and is adjacent to lead 77, parallel with the longer side 71a.

Electric power is supplied to the driver circuit portion 7, comprising the high voltage portion, through the lead 77. One electrode 12 is used for cascade connection to an adjacent chip 70. A power supply lead 79, connected with the electrodes 13 for liquid crystal driving power supply voltage $V_3$, extends beside the lead 78 parallel with the longer side 71a. The lead 78 is disposed on the driver circuit portion 7 and close to the level shift circuit portion 6. The lead 78 supplies electric power to the driver circuit portion 7. One electrode 13 is used for cascade connection. A power supply lead 80 connected with electrodes 14 for final liquid crystal driving power supply voltage $V_5$ is adjacent to lead 79 and parallel with the longer side 71a.

The lead 80 supplies electric power to the driver circuit portion 7. One electrode 14 is used for cascade connection to succeeding stages of adjacent chips. In this way, the power supply leads 76, 77, 78, 79, 80 for applying voltages $V_H$, $V_0$, $V_2$, $V_3$, $V_5$, respectively, to the driver circuit portion 7 extend parallel to each other on the driver circuit portion 7. These leads are not arranged so as to form a closed loop making one revolution around the row of electrodes $8_1$–$8_N$. The electrodes 15 for the power supply voltage $V_H$ are formed at both ends of the row of electrodes $8_1$–$8_N$. The electrodes 11, 12, 13, 14 for the power supply voltages $V_0$, $V_2$, $V_3$, $V_5$, respectively, and the electrodes $8_1$–$8_N$ form two rows. The grounding lead connected with the grounding electrode 19 (GND) separates into three leads 81, 82, and 83.

The inner grounding lead 81 is arranged at the boundary between the driver circuit portion 7 and the level shift circuit portion 6. The intermediate grounding lead 82 is disposed at the boundary between the level shift circuit portion 6 and the latch circuit portion 5. The outer grounding lead 83 is disposed on the outer side of the shift register circuit portion 3. The outer power supply lead 84, branching from the power supply lead 76 for the power supply voltage $V_{CC}$, is disposed on the level shift circuit portion 6. A power supply lead 85 connected with the electrode 10 for low voltage power supply $V_{CC}$ is arranged at the boundary between the latch circuit portion 5 and the shift register portion 3. A row of input and output signal electrodes 75 is disposed between two rows of electrodes 11, 12, 13, 14. In this way, the power supply leads pass to both ends of the row of electrodes $8_1$–$8_N$. In this layout, the power supply leads or the signal leads can be made shorter than in conventional devices. In the present embodiment, the electrodes and the leads are laid out so as to permit thin width chips along thin marginal regions 102 in FIG. 8A. Furthermore, locating and supporting dummy electrodes or pads 73a and 73b are formed at the corners of the longer side 71a.

FIG. 7 is a plan view of the chip of the above embodiment in which the chip is mounted by TAB (tape automated bonding). It is to be noted that like components are indicated by like reference numerals in various figures and that those components which have been already described will not be described below. Chip 70 has the above-described layout and is carried by a tape carrier or film 92. A lead pattern corresponding to the arrangement of the electrodes on chip 70 is formed on plastic film 92 having sprocket holes 52a and device lead hole 92b. Tape carrier 92 has slits 93a and 93b, adjacent to lead slit 92b, and the size of their respective openings are of different area to permit control of the passage of molten resin. The lead pattern extends into the device lead hole 92b for connection to the bumps 51. The lead pattern comprises finger leads (or inner leads) 56 to be bonded, outer leads 57 to be bonded to the row or column electrodes of an LCD panel, and extended lead portions 88 for connecting together the finger leads 56 and the outer leads 57. Terminals 58 are formed at the front ends of the extended lead portions 88 connected with the face of the film 92 on the side of a printed-wiring board. The bumped chip 70 is bonded to the tape carrier 92 by TAB, similarly to that described in Embodiment 1. The length of the cantilevered portions (or the length of the protruding portions) of the finger leads 56 is $Y_1$. The length of the cantilevered portions where the film rib 70b on the side of the LCD panel does not exist is $Y_3$, such that $Y_1 < Y_3$. It substantially follows that the length of the cantilevered portions is reduced by $Y_3 - Y_1$. This amount of reduction is larger than the amount of reduction $Y_2 - Y_1$ shown in Embodiment 1.

FIG 8A is a plan view showing chip 70 installed in a marginal region 102 of a liquid crystal panel using COG mounting techniques. Also, in this case, portions 88a of the extended lead portions 88 lie on chip 70, because the bumps 51 are formed at the opposite side from the longer side 71a of chip 70. The length of the overlying portions 88a is substantially equal to the above mentioned amount of reduction of the inner leads 56, i.e., $Y_3 - Y_1$. Since the width of the chip 70 can be made smaller than that of chip 30 of Embodiment 1, the width $W_2$ of the marginal region 102 of this embodiment can be made smaller than the width $W_1$ of Example 1 as illustrated in FIG. 8B.

In summary, a semiconductor device having the novel circuit cell array can be applied to an LCD driver IC. In addition, the device can be applied to a display driver IC, a printer driver IC, a sensor interface IC, a gate array, other multi-bit IC in which circuit cells and electrodes are arrayed in pairs, and other multi-bit IC having numerous outputs or inputs. Where the semiconductor device is applied to a data input or output device, the width of the region occupied by the chip can be reduced.

Thus, while there have been shown and described fundamental novel features of the invention as applied to preferred embodiments thereof, it will be understood that various omissions and substitutions and changes in the form and details of the disclosed invention may be made by those skilled in the art without departing from the spirit of the invention. The intention, therefore, is to be limited only as indicated by the scope of the claims appended hereto.

I claim:

1. A liquid crystal apparatus having a liquid crystal display panel with a plurality of driver IC chips for driving the panel, each of said driver IC chips having a chip layout comprising:

two sets of circuit portions, each set being composed of groups of stages that are arranged in rows, and the groups of stages of each set further forming a plurality of bit cells, with each bit cell containing said plurality of stages, wherein said two sets are separated from one another by a central region of the chip, which central region is formed between said sets along a first central line, said plurality of bit cells extend parallel to a second central line that is substantially perpendicular to the first central line;

a plurality of output electrodes in communication with said sets and arranged in said central region of said chip in a direction along said first central line;

a plurality of power source electrodes in said central region at ends of said output electrodes; and a plurality of dummy electrodes for alignment of said chip arranged at four corners of said chip.

2. A liquid crystal apparatus having a liquid crystal display panel with a plurality of driver IC chips for driving the panel, each of said driver IC chips having a chip layout comprising:

one set of circuit portions, the set being composed of groups of stages that are arranged in rows, and the groups of stages further forming a plurality of bit cells, with each bit cell containing said plurality of stages, wherein said set is formed in a central region of the chip, which central region is formed along a first central line, said plurality of bit cells extend parallel to a second central line that is substantially perpendicular to the first central line;

a plurality of output and power source electrodes arranged between said central region and one first side of said chip, the first side being along said first central line; and a plurality of dummy electrodes for alignment of said chip arranged at two corners of the chip along another second side opposite to the first side, the second side being along said first central line.

3. The liquid crystal apparatus of claim 1 wherein said plurality of driver IC chips are arranged on a marginal region of the liquid crystal panel and the output electrodes of each driver IC chip are connected to electrodes of the liquid crystal panel.

4. The liquid crystal apparatus of claim 2, wherein said plurality of driver IC chips are arranged on a marginal region of the liquid crystal panel and the output electrodes of each driver IC chip are connected to electrodes of the liquid crystal panel.

5. The liquid crystal apparatus of claim 1 further comprising a film having a plurality of slit openings and a plurality of leads, wherein one of the slit openings is arranged over the output electrodes of one of the driver IC chips and the leads of the film are connected to the output electrodes of the one of the driver IC chips at said one of the slit openings and at least one of the slit openings is arranged over the dummy electrodes of the one of the driver IC chips.

6. The liquid crystal apparatus of claim 2 further comprising a film having a plurality of slit openings and a plurality of leads, wherein one of the slit openings is arranged over the output electrodes of one of the driver IC chips and the leads of the film are connected to the output electrodes of the one of the driver IC chips at said one of the slit openings and at least one of the slit openings is arranged over the dummy electrodes of the one of the driver IC chips.

* * * * *